(12) United States Patent
Lu et al.

(10) Patent No.: US 6,576,867 B1
(45) Date of Patent: Jun. 10, 2003

(54) METHOD AND APPARATUS FOR REMOVAL OF MOLD FLASH

(75) Inventors: Yong Feng Lu, Singapore (SG); Yak Hui Sim, Singapore (SG); Qiong Chen, Singapore (SG); Long Chen Lai, Singapore (SG); Bin Othman Rustam, Singapore (SG)

(73) Assignees: Advanced Systems Automation Ltd., Singapore (SG); Data Storage Institute, Singapore (SG)

( * ) Notice: Subject to any disclaimer, the term of this patent is extended or adjusted under 35 U.S.C. 154(b) by 0 days.

(21) Appl. No.: 09/857,724

(22) PCT Filed: Dec. 3, 1999

(86) PCT No.: PCT/SG99/00153

§ 371 (c)(1),
(2), (4) Date: Feb. 12, 2002

(87) PCT Pub. No.: WO00/37209

PCT Pub. Date: Jun. 29, 2000

(30) Foreign Application Priority Data

Dec. 7, 1998 (SG) .............................. 9805236

(51) Int. Cl.[7] .............................................. B23K 26/36
(52) U.S. Cl. ................................................ 219/121.69
(58) Field of Search ....................... 219/121.69, 121.68, 219/121.67, 121.7, 121.71, 121.82

(56) References Cited

U.S. PATENT DOCUMENTS 5,144,747 A * 9/1992 Eichelberger
5,257,706 A * 11/1993 McIntyre
5,961,860 A * 10/1999 Lu et al.
6,074,894 A * 6/2000 Suetsugu et al.

FOREIGN PATENT DOCUMENTS

JP 5-243296 * 9/1993
WO WO 86/07492 * 12/1986

OTHER PUBLICATIONS

Translation to JP 5-243296. Jul. 2002. p 1-3.*

* cited by examiner

*Primary Examiner*—Tom Dunn
*Assistant Examiner*—Jonathan Johnson
(74) *Attorney, Agent, or Firm*—Lawrence Y. D. Ho & Assoc.

(57) ABSTRACT

A method and apparatus for the removal of mold flash from an IC device using a non-thermal laser ablation method. Ablation is achieved under conditions in which the mold flash is converted to plasma under short laser pulses which do not give sufficient time or energy for significant thermal processes to occur. As a result, the heat sink underneath the mold flash is prevented from heating up due to lack of heat transfer, thereby protecting the heat sink from heat damages. According to one feature of the invention, a mask is provided to protect the molded packaging of the IC device from the laser beam. The mask has at least one hole which corresponds to the heat sink of the device wherethrough the laser beam can pass. According to another feature of the invention, a large beam diameter is provided to increase the efficiency of the deflashing process.

15 Claims, 4 Drawing Sheets

METHOD AND APPARATUS FOR REMOVAL OF MOLD FLASH

FIELD OF THE INVENTION

The present invention is related to the packaging of semiconductor devices. In particular, the present invention is related to the method and apparatus for the removal of mold flashes found in integrated circuit (IC) devices packages using laser technology.

BACKGROUND OF THE INVENTION

The packaging of semiconductor and IC devices by plastic molding of the chip is well known in the art. The package typically contains a molded plastic covering which protects the IC devices inside. A metallic heat sink exposed on the surface of the plastic packaging allows efficient heat transfer between the IC device and the exterior environment. Leads extending from the packages allow electrical connection between the device and the external circuitry.

During the packaging process, the IC device, with the heat sink and the leads, is retained in a mold wherein molten plastic is injected. When the molten plastic is solidified, the IC chip becomes embedded in the plastic packaging. The metallic heat sink ideally should be free of any excess molding material known as mold flash. However, due irregularities in the mold, mold flash is inevitably bled onto the edges of the heat sink.

Traditional ways of removing mold flash from IC packages, such as sand blasting, water jetting and chemical etching, can easily damage or affect the reliability of the packaging. Recently laser-induced removal of mold flash has been suggested.

Singapore patent 49545 describes the use of short wavelength pulse laser for the removal of mold flash. In this prior art document, a short wavelength laser is used as a heat source and a momentum source for the removal of the mold flash. Using this method, the region with mold flash, such as the interface between the leads and the lead frame itself, is heated up. Thermal expansion of the lead frame occurs, and due to the difference between the expansion coefficient of the lead frame metal and that of the mold flash, the lead frame metal expands more than the mold flash. In addition, the laser beam as a momentum source, which further destroys any bonding between the metallic lead surface and the mold flash. These two actions results in the cleavage of the mold flash from the lead frame. This method, however, cannot be directly applied to the deflashing of the heat sink of the IC devices, since thermal expansion of the heat sink is not desirable or useful in the deflashing process.

In other instances, laser is used in a thermal melting process, in which the flash is melted and vaporized. Although the mold flash may be removed in this way, the high heat intensity generated by this method causes traces of melting on the metal surface of the heat sink, which can produce micro-cracks and other damages. As a result, there is a need to search for other techniques which are effective and gentle on the IC device.

OBJECT OF THE INVENTION

It is therefore an object of the present invention to provide a method and apparatus for laser removal of mold flash which overcome the shortcomings as stated above.

It is another object to provide one embodiment of a laser apparatus which has high efficiency but minimizes damages to the packaging itself.

Other objects and features of the invention will become apparent to those skilled In the art as the disclosure is made in the following detailed description of the preferred embodiments as illustrating in the accompanying sheets of drawings.

SUMMARY OF THE INVENTION

The present invention is a method and apparatus for the removal of mold flash from an IC device using a laser ablation method. Ablation is achieved under conditions in which the mold flash is converted to plasma under short laser pulses which do not give sufficient time or energy for significant thermal processes to occur. As a result, the metallic portion adjacent the mold flash, such as the heat sink underneath, is prevented from heating up due to lack of heat transfer, thereby protecting the metallic surface and the interior die from heat damages. According to one embodiment of the invention, a mask is provided to protect the molded packaging of the IC device from the laser beam. The mask may have at least one hole which corresponds to the heat sink of the device wherethrough the laser beam can pass. According to another embodiment of the invention, a large beam diameter is provided to increase the efficiency of the deflashing process.

In the preferred embodiment, the fluence of the laser beam is kept low at below $1J/cm^2$, the wavelength of the laser used is below 550 nm, while the pulse width of the beam is kept between 8–10 ns. With a beam spot diameter of 12–15 mm, deflashing by photodecomposition can be effective performed. Together with the mask, entire strips of IC devices may be deflashed by scanning the beam across the strip.

DESCRIPTION OF THE INVENTION

Figure 1:
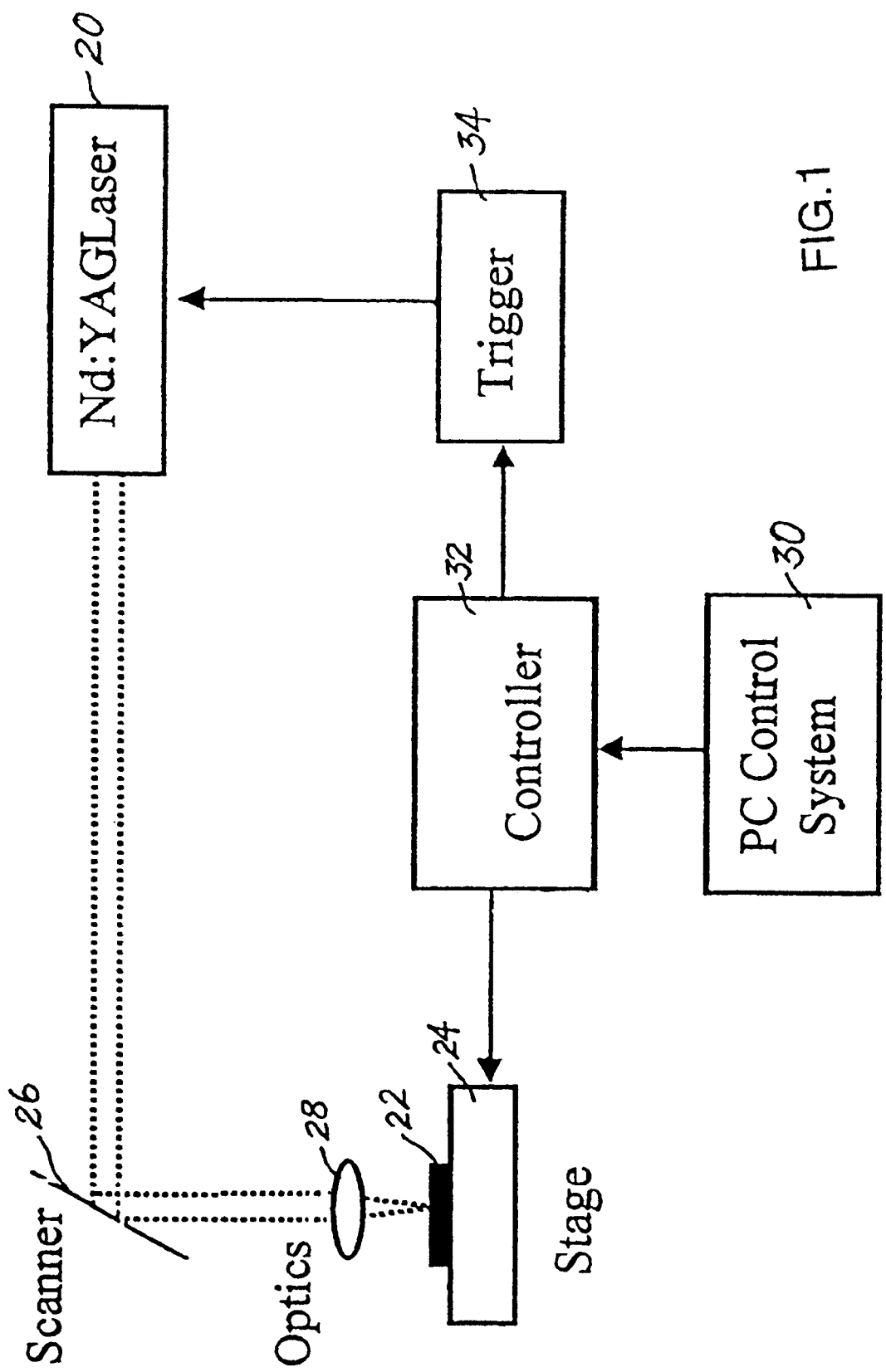
FIG. 1 is a schematic diagram of a laser deflashing system according to the present invention.

The apparatus and method according to the present invention allows efficient removal of mold flash while minimizing heat, chemical or mechanical damage to the metal or molded part of an IC devices. The invention uses laser energy to selectively convert the mold flash to plasma by taking advantage of the difference between the light absorption characteristics of the mold flash (which is typically dark plastic such as epoxy), and that of the heat sink (which is typically a flat, shinny metallic surface). Laser ablation is defined in the present invention as the conversion of the mold flash into plasma and other volatile species due to photodecomposition by the laser beam.

Table 1 shows an example of the property of a short wavelength Nd:YAG laser beam which causes ablation of the mold flash according to the present invention as compared to a prior art processes. These conditions allow the metallic surfaces of the heat sink at the heat effective depth to remain below 300° C. during the deflashing process, and is therefore a vast improvement over the prior art laser process which results in the heat sink being heated above 1000° C. The heat effective depth ($\mu$) and the temperature rise ($\Delta T$) of a surface is determined by the material of the surface and the amount of input energy and can be determined by the equations:

$$\mu = (4D\tau)^{1/2} = (4k\tau/\rho c)^{1/2} \text{ and}$$

$$\Delta T = (1-R)I/\rho c \mu$$

where $\rho$ (g/cm3) is the density; c (J/kg·K) is specific heat; k (cal/cm·K) is thermal conductivity; R is the reflectivity; $\tau$ (ns) is the pulse width of the laser and I (mJ/cm$^2$) is the fluence.

For copper material, $\tau$=8.96; c=380; k=0.941 and R=0.25; and if

I=250 mJ/cm$^2$, $\tau$=8 ns, then $\mu$=1.92 $\mu$m and $\Delta T$=287° C.

Since the melting temperature of copper is 1083° C. while that of nickel is 1453° C., the prior art thermal evaporation process would have caused heat damage to the heat sink, and even to the die inside the packaging. On the other hand, the low temperature laser ablation process can be applied to heat sink which have been pre-plated without causing heat damage even to the more delicate surface treatments used in the art.

TABLE 1

| LASER PROPERTY | PRIOR ART 1 | PRIOR ART 2 | PRESENT INVENTION |
|---|---|---|---|
| Wavelength | 1064/532 nm | 248 nm | 1064/532 nm |
| Pulse width | 6 ns | 20 ns | 8–10 ns |
| Pulse energy | 300 mJ/532 nm | 300 mJ/248 nm | 500 mJ/532 nm |
| Repetition Rate | 50 Hz | NS | 50 Hz |
| Cooling | water | air | water |
| Beam spot dimension (diameter) | 2.5 mm | NS | 2–15 mm |
| Fluence | 22.6 J/cm$^2$ | >1 J/cm$^2$ | <1 J/cm$^2$ |

NS: Not specified

The properties of the present invention stated in Table 1 are examples only, and it would be clear to one skilled in the art that the parameters may be altered while still achieving laser ablation of the mold flash. The most important parameter is the fluence, as shown by the calculation of $\mu$ and $\Delta T$ above, which has to be kept low, for example 0.2–0.7 J/cm$^2$, to prevent excess energy from being converted into heat. The pulse width should also be kept low, such that there is insufficient time for the transfer of heat from the flash material to the heat sink below. The beam spot can vary depending on the type of the application. For a device with a relatively large heat sink, or for the ablation of flash material between the leads or within the lead frame, it may be more efficient to use a large beam spot, such as 8–10 mm. This is most applicable for a Nd:YAG laser, in which the energy generated in higher. However, if the repetition rate can be maintained at a high level, a smaller beam spot may be used without compromising efficiency. The scanning speed of the laser beam may be adjusted to allow effective ablation to occur. The wavelength of 532 nm is most preferred, since it is a green laser within the visible range, and gives good selectivity in the decomposition process. In addition, the cost of the optics needed for the green laser is relatively low. However, other wavelengths, such as 248 nm and 351 nm of excimer lasers may also be adapted for the laser ablation process according to the present invention.

Besides removal of mold flash, the present laser ablation process also has the added advantage of removing oxides from the surface of the heat sink. The metallic oxides may be converted to plasma by the same selective ablation process. The beam spot according to one preferred embodiment of the present invention is wider, for example 10–15 mm, such that the heat sink may be exposed to the laser beam efficiently. In order to protect the molded packaging itself, a mask is provided for this embodiment. The mask may be a metallic template which has one or more holes corresponding to the heat sink of one or more IC devices. The metallic frame of the template protects the IC packaging from the laser beam. Using this large diameter laser beam, it becomes possible to treat the entire surface of the heat sink in a short period of time as the beam may be scanned over a plurality of IC devices, for example across a row of IC devices in a strip. This has the added advantage that the oxide layer of the metallic heat sink can also be ablated, i.e. decomposed into plasma and other decomposition species. As a result, removal of the oxide layer may also be achieved. If plating can be performed immediately after deflashing, then this laser ablation process provides the possibility of eliminating the chemical oxide-removal step as well. If removal of flash is along the edge of the device, e.g. at the interface of the leads and lead frame, the mask may also be used to protect the mold packaging itself.

FIG. 1 shows an example of a laser deflashing system in which the beam of a Nd:YAG laser 20 is directed onto the heat sink of an IC device 22 on a stage 24 by the use of a scanner 26 and appropriate optical lenses 28. A computer control system 30 controls a controller 32 which in turn controls the stage 24 and the triggering of the laser via a trigger 34.

Figure 2:
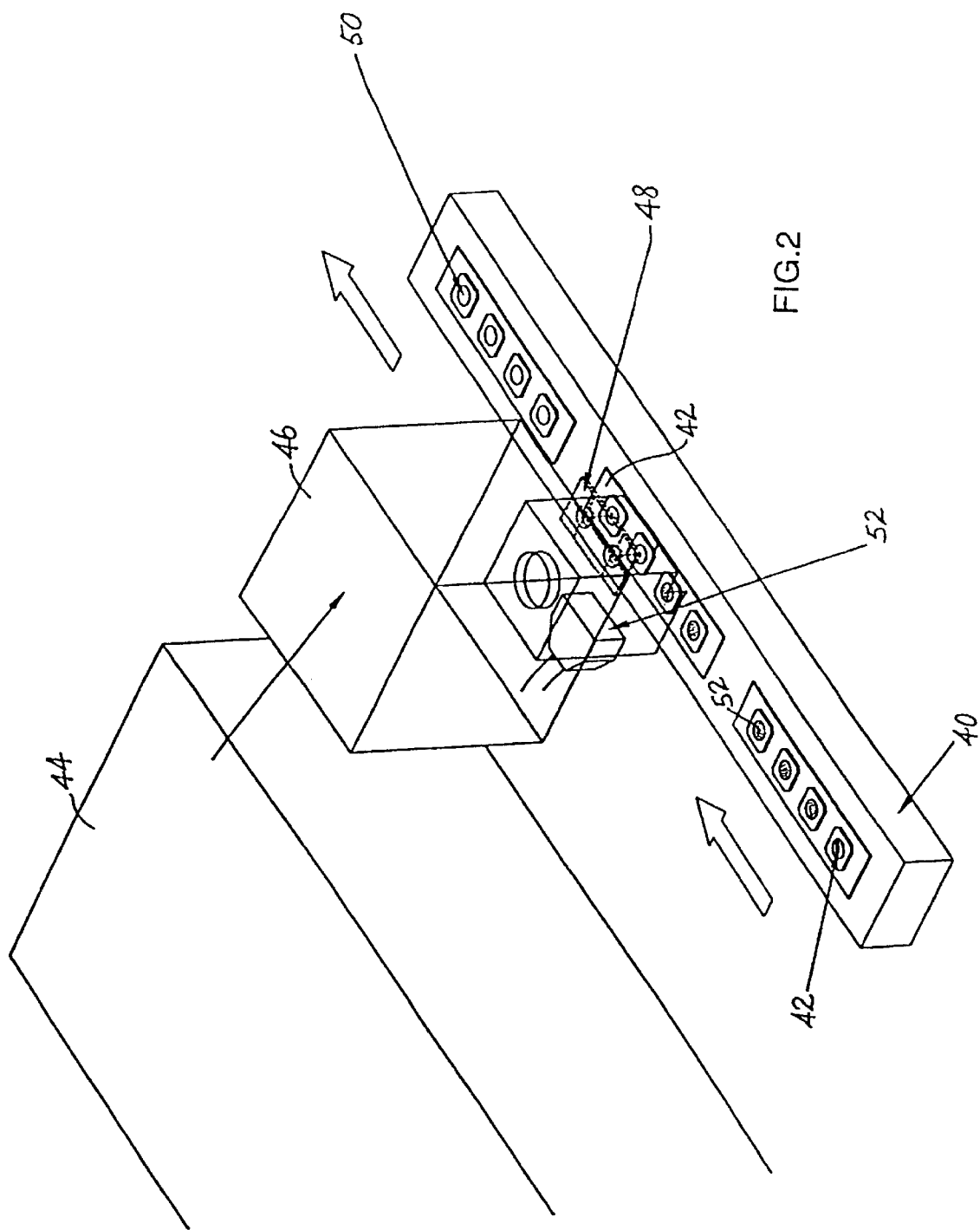
FIG. 2 is a schematic diagram of another laser deflashing apparatus according to the present invention.

FIG. 2 shows the details of a specific example of an apparatus for deflashing of IC devices. In this apparatus, the IC devices in singulated form 42 are transferred on a guide track 40 to the deflashing area. A laser beam from a laser generator 44 is directed into a scanner or galvonometer 46 which directs the beam to the appropriate positions. A mask 48 is provided between the scanner 46 and the IC device 42 for protecting the IC device packaging from the laser beam. The scanner may be programmed such that the laser beam removed oxide or mold flash either at the perimeter of the heat sink only, or for the entire surface of the heat sink 50. In this embodiment, an exhaust inlet 52, is provide to suck away the decomposed fume generated by the ablation of the mold flash. An air blower (not shown) may also be optionally provided for blowing away the ionized vapor as it is formed such that it does not have a chance to deposit back onto the IC device.

Figure 3:
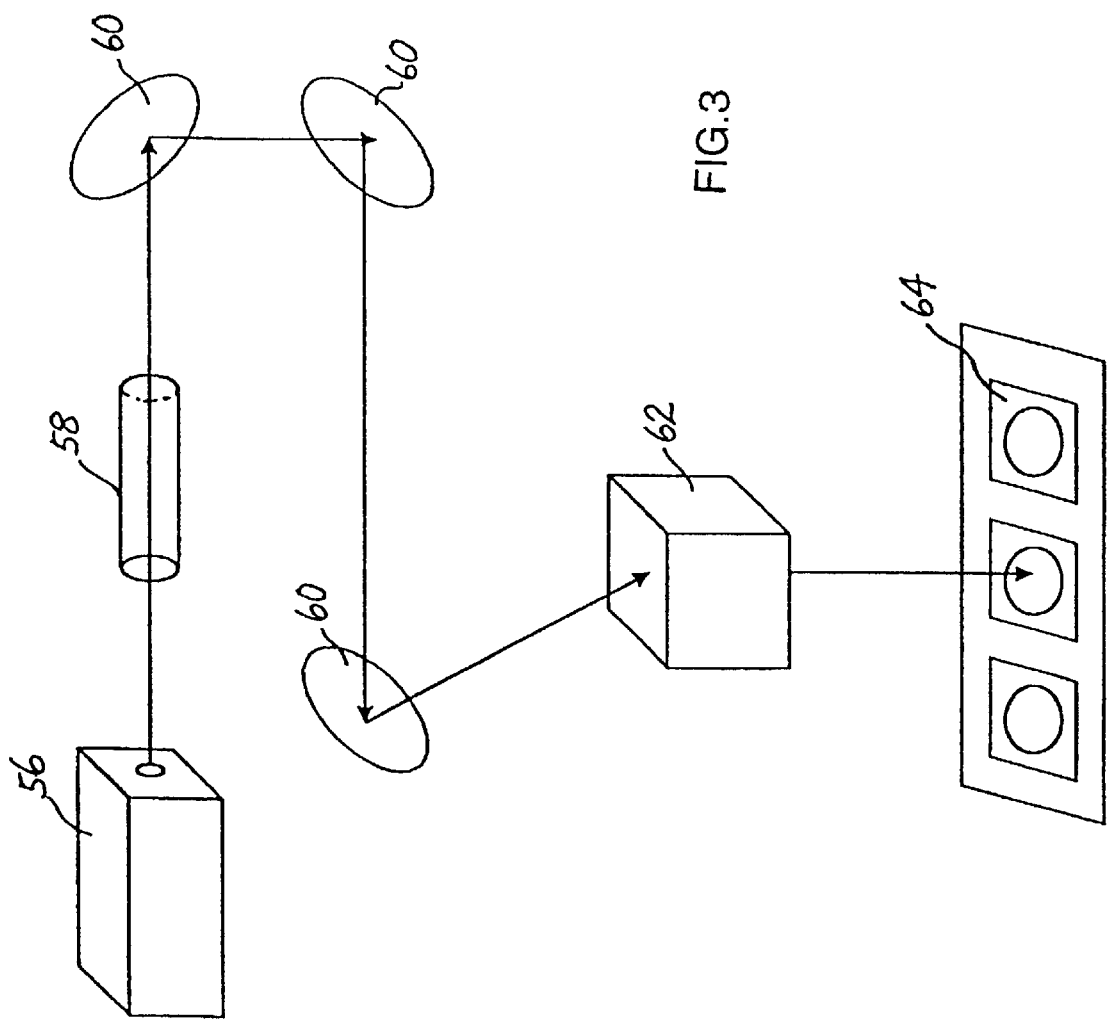
FIG. 3 is a schematic diagram to show the path of the laser beam in a laser deflashing apparatus according to the present invention.

FIG. 3 shows a third embodiment of the present invention in which the laser generator 56 is position sideways. In this embodiment, a beam expander 58 is provided to enlarge the beam spot diameter, and a series of mirrors 60 are used to direct the laser beam onto the X-Y scanner or galvonometer 62. The scanner then directs the beam onto the appropriate spots on the IC device 64.

Figure 4:
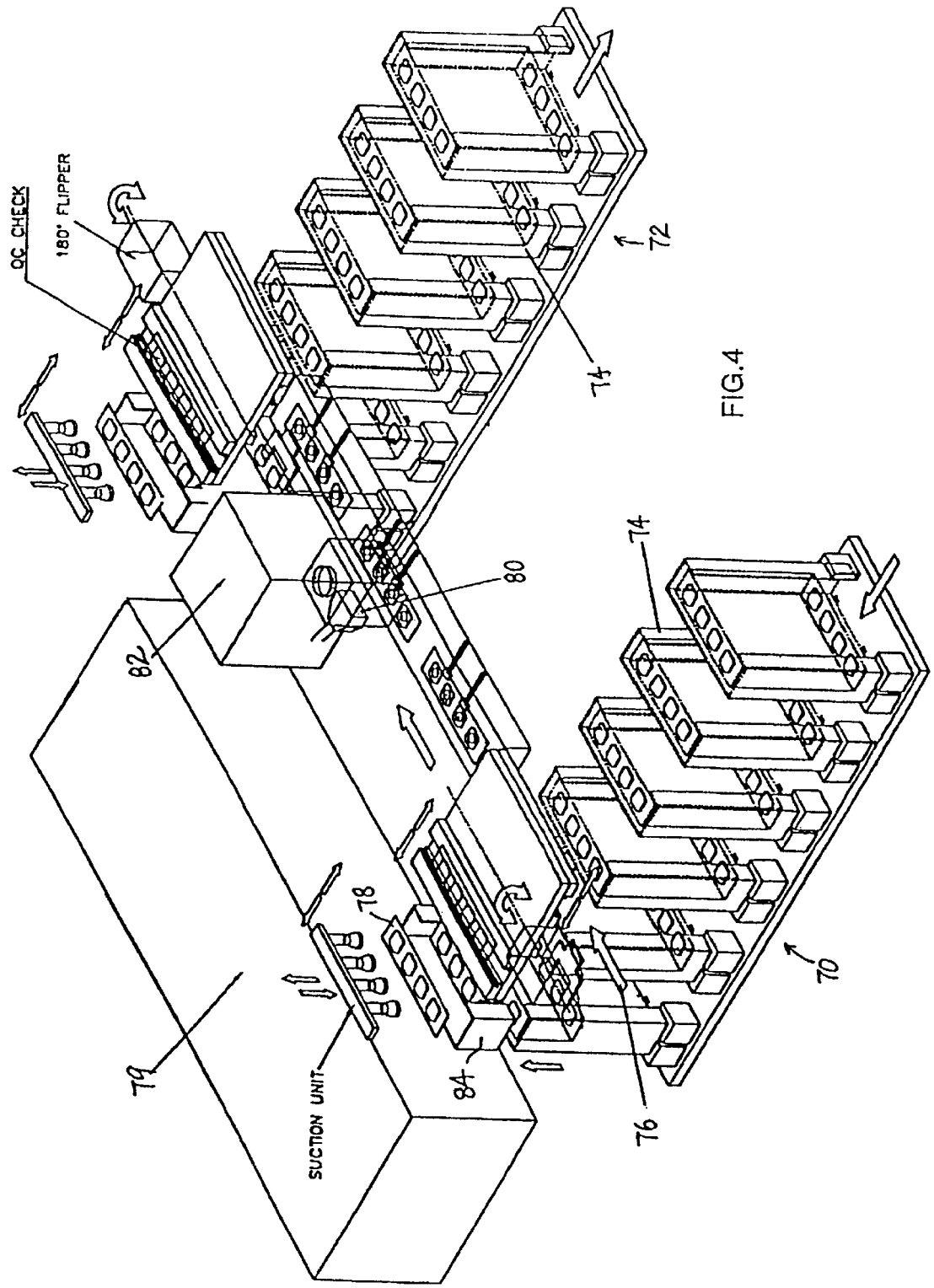
FIG. 4 is a schematic diagram to show a laser deflashing system adapted to function in-line with an on-load-off-load station.

The deflashing process can be adapted to suit conventional molding processes, as shown in the example of FIG. 4. The deflashing apparatus may be provided between the standard onload station 70 and offload station 72 with the standard magazines 74. The indexing fork 76 grips a leadframe 78 from a standby position and index the leadframe a pre-determined distance to the laser scanning position. Laser generator 79 is used to generate the laser beam. Suction from the suction head 80 is switched on to remove fumes, flashes and dust generated during scanning. After scanning by the scanner 82, the leadframe will be indexed or transported to a temporary leadframe storage area called leadframe buffer 84. Leadframes are stored there before an empty leadframe magazine 74 is ready to receive the processed leadframes. This process may also be used with singulated packages with minor changes, such as using trays or carriers.

While the present invention has been described particularly with references to FIGS. 1 to 4, it should be understood that the figures are for illustration only and should not be taken as limitation on the invention. In addition it is clear that the method and apparatus of the present invention has utility in many applications where removal of plastic mold material is required. It is contemplated that many changes and modifications may be made by one of ordinary skill in the art without departing from the spirit and the scope of the invention described.

What is claimed is:

1. A laser deflashing apparatus for removal of mold flash of an IC device comprising:
    a laser generator for generating a laser beam, said laser beam having a fluence and pulse duration adapted for laser ablation of said mold flash;
    an optical system for delivering said laser beam; a transfer system for transferring said IC devices into the path of said laser beam, and
    a mask provided between said laser generator and said IC device for protecting the molded packaging of said IC device from said laser beam, said mask having at least one hole corresponding to a heat sink on said package wherethrough said laser beam can pass.

2. An apparatus according to claim 1 further comprising scanning means for directing said beam onto the flash of said IC device.

3. An apparatus according to claim 2 wherein said optical system comprises a focusing lens for focusing said laser beam.

4. An apparatus according to claim 2 wherein said optical system comprises telescopic means for altering the size of the beam spot of said laser beam.

5. An apparatus according to claim 2 wherein said optical system further comprising a controller for controlling said laser beam.

6. An apparatus according to claim 2 wherein said transfer system comprises
    a stage for holding IC devices indexing means for transferring said IC devices onto said stage and removing said IC devices after deflashing is completed.

7. An apparatus according to claim 2 wherein said laser beam has a wavelength of less than 550 nm, a fluence of less than 1 J/cm$^2$.

8. An apparatus according to claim 2 wherein said scanning means comprising a galvanometer.

9. An apparatus according to claim 2 wherein said laser generator generates a Nd:YAG laser beam with wavelength of 532 nm and having a pulse energy of about 500 mJ.

10. An apparatus according to claim 2 wherein said laser generator generates a laser beam with a beam spot diameter of 8 to 10 mm.

11. An apparatus according to claim 2 further comprising a mask provided between said laser generator and said IC device for protecting the molded packaging of said IC device from said laser beam.

12. An apparatus according to claim 2 further comprising a visual checking system provided for visual inspection of said IC device after laser ablation.

13. An apparatus according to claim 2 further comprising an exhaust system for removing decomposition fume generated by the ablation of the mold flash material.

14. An apparatus according to claim 2 further comprising an exhaust system and an air blower, said air blower directing air onto said device as laser ablation occurs, said exhaust system for removing decomposition fume generated by the ablation of the mold flash material.

15. A laser deflashing apparatus according to claim 1 further comprising:
    holding means for holding and positioning a strip of IC devices in a position in the path of said laser beam;
    scanning means for directing said laser beam onto the mold flash of said IC device;
    a laser-impermeable mask, positioned between said laser generator and said holding means, for protecting the molded packaging of said IC devices from said laser beam;
    an indexing system for transferring said IC device onto said holding means, shifting said strip for deflashing of sequential IC devices, and removing said strip after deflashing is completed on all IC devices on said strip; and
    a suction system with a suction inlet proximate said holding means for removing fumes of said ablated mold flash.

* * * * *